United States Patent
Ritzdorf et al.

(10) Patent No.: US 7,161,689 B2
(45) Date of Patent: *Jan. 9, 2007

(54) APPARATUS AND METHOD FOR PROCESSING A MICROELECTRONIC WORKPIECE USING METROLOGY

(75) Inventors: Thomas L. Ritzdorf, Bigfork, MT (US); Steve L. Eudy, Bigfork, MT (US); Gregory J. Wilson, Kalispell, MT (US); Paul R. McHugh, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 114 days.

This patent is subject to a terminal disclaimer.

(21) Appl. No.: 10/685,306

(22) Filed: Oct. 14, 2003

(65) Prior Publication Data
US 2005/0107971 A1 May 19, 2005

Related U.S. Application Data

(63) Continuation of application No. 09/612,176, filed on Jul. 8, 2000, now Pat. No. 6,747,734.

(51) Int. Cl.
*G01B 11/28* (2006.01)
*H01L 21/00* (2006.01)
*H01L 21/66* (2006.01)
*G01R 31/26* (2006.01)
*C25D 5/00* (2006.01)
*C25D 21/12* (2006.01)

(52) U.S. Cl. .............. 356/630; 438/5; 438/7; 438/14; 438/16; 205/81; 205/84; 204/228.7

(58) Field of Classification Search .. 356/237.2–237.5, 356/630
See application file for complete search history.

(56) References Cited

U.S. PATENT DOCUMENTS

| | | | | |
|---|---|---|---|---|
| 5,096,550 A | * | 3/1992 | Mayer et al. | ............... 205/642 |
| 5,363,171 A | | 11/1994 | Mack | |
| 5,393,624 A | | 2/1995 | Ushijima | |
| 5,658,183 A | | 8/1997 | Sandhu | |
| 5,719,495 A | | 2/1998 | Moslehi | |
| 5,872,633 A | | 2/1999 | Holzapfel | |

(Continued)

FOREIGN PATENT DOCUMENTS

EP   108175   12/2000

(Continued)

OTHER PUBLICATIONS

International Search Report for International Application No. PCT/US01/21579 mailed Nov. 16, 2001; Applicant: Semitool, Inc. 3 pgs.

*Primary Examiner*—Gregory J. Toatley, Jr.
*Assistant Examiner*—Gordon J. Stock, Jr.
(74) *Attorney, Agent, or Firm*—Perkins Coie LLP

(57) ABSTRACT

A processing apparatus for processing a microelectronic workpiece includes a metrology unit and a control, signal-connected to the metrology unit. The control can modify a process recipe or a process sequence of the processing apparatus based on a feed forward or a feed back signal from the metrology unit. A seed layer deposition tool, a process layer electrochemical deposition tool, and a chemical mechanical polishing tool, arranged for sequential processing of a workpiece, can be controlled as an integrated system using one or more metrology units. A metrology unit can be located at each tool to measure workpiece parameters. Each of the metrology units can be used as a feed forward control and/or a feed back control at each of the tools.

17 Claims, 7 Drawing Sheets

U.S. PATENT DOCUMENTS

| | | |
|---|---|---|
| 5,900,633 A | 5/1999 | Solomon et al. |
| 5,924,058 A | 7/1999 | Waldhauer |
| 5,948,203 A | 9/1999 | Wang |
| 5,964,643 A | 10/1999 | Birang |
| 6,004,047 A | 12/1999 | Akimoto |
| 6,017,437 A | 1/2000 | Ting |
| 6,025,600 A | 2/2000 | Archie |
| 6,045,618 A | 4/2000 | Raoux |
| 6,051,284 A | 4/2000 | Byrne |
| 6,077,412 A | 6/2000 | Ting |
| 6,110,011 A | 8/2000 | Somekh |
| 6,117,780 A * | 9/2000 | Tsai et al. ............... 216/85 |
| 6,122,046 A | 9/2000 | Almogy |
| 6,132,289 A | 10/2000 | Labunsky et al. |
| 6,159,073 A | 12/2000 | Wiswesser |
| 6,168,693 B1 | 1/2001 | Uzoh |
| 6,187,072 B1 | 2/2001 | Cheung |
| 6,190,234 B1 | 2/2001 | Swedek |
| 6,193,802 B1 | 2/2001 | Pang |
| 6,194,628 B1 | 2/2001 | Pang |
| 6,197,181 B1 | 3/2001 | Chen |
| 6,201,240 B1 | 3/2001 | Dotan |
| 6,208,751 B1 | 3/2001 | Almogy |
| 6,231,743 B1 | 5/2001 | Etherington |
| 6,238,539 B1 | 5/2001 | Joyce |
| 6,244,931 B1 | 6/2001 | Pinson |
| 6,247,998 B1 | 6/2001 | Wiswesser |
| 6,251,692 B1 | 6/2001 | Hanson |
| 6,255,222 B1 | 7/2001 | Xia |
| 6,270,619 B1 | 8/2001 | Suzuki et al. |
| 6,270,634 B1 | 8/2001 | Kumar et al. |
| 6,277,194 B1 | 8/2001 | Thilderkvist |
| 6,280,289 B1 | 8/2001 | Wiswesser |
| 6,283,692 B1 | 9/2001 | Perlov |
| 6,284,622 B1 | 9/2001 | Campbell |
| 6,296,548 B1 | 10/2001 | Wiswesser |
| 6,303,395 B1 | 10/2001 | Nulman |
| 6,303,931 B1 | 10/2001 | Menaker |
| 6,309,276 B1 | 10/2001 | Tsai |
| 6,318,384 B1 | 11/2001 | Khan |
| 6,331,490 B1 | 12/2001 | Stevens |
| 6,352,467 B1 | 3/2002 | Somekh |
| 6,391,166 B1 * | 5/2002 | Wang ............... 204/224 R |
| 6,428,673 B1 | 8/2002 | Ritzdorf |
| 6,444,481 B1 | 9/2002 | Pasadyn |
| 6,447,668 B1 | 9/2002 | Wang |
| 6,454,899 B1 | 9/2002 | Campbell |
| 6,486,036 B1 | 11/2002 | Miethke et al. |
| 6,511,898 B1 | 1/2003 | Sonderman |
| 6,534,328 B1 | 3/2003 | Hewett |
| 6,690,473 B1 * | 2/2004 | Stanke et al. ............ 356/601 |
| 6,747,734 B1 * | 6/2004 | Ritzdorf et al. ......... 356/237.5 |
| 2002/0032499 A1 | 3/2002 | Wilson et al. |
| 2003/0020928 A1 | 1/2003 | Ritzdorf et al. |
| 2003/0066752 A1 | 4/2003 | Ritzdorf et al. |
| 2004/0245094 A1 | 12/2004 | McHugh et al. |

FOREIGN PATENT DOCUMENTS

| | | |
|---|---|---|
| EP | 1058172 | 12/2000 |
| EP | 1058173 | 12/2000 |
| WO | WO-83/03636 | 10/1983 |
| WO | WO-99/25004 | 8/2000 |
| WO | WO-00/70495 | 11/2000 |
| WO | WO-02/04886 | 1/2002 |
| WO | WO-02/04887 | 1/2002 |
| WO | WO-04/110698 | 12/2004 |

\* cited by examiner

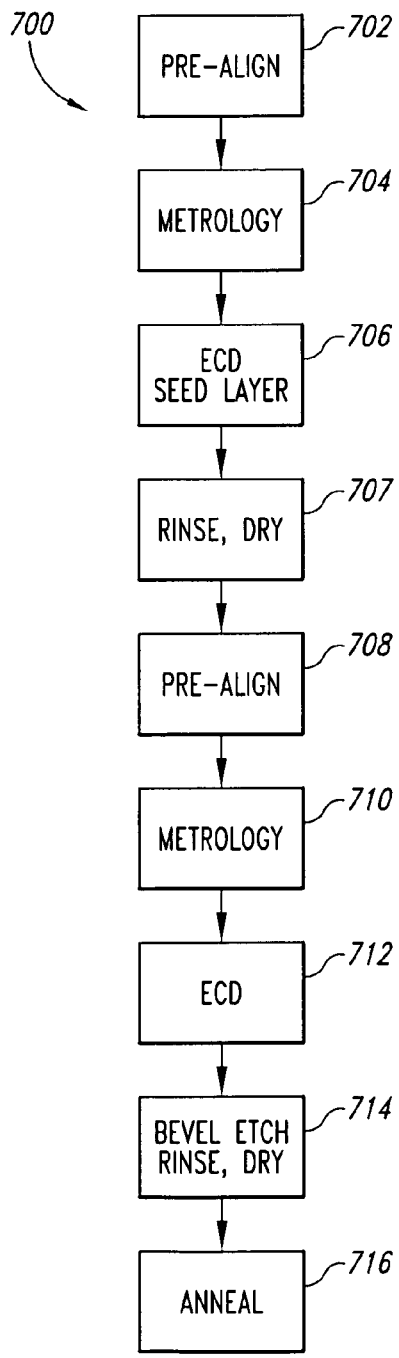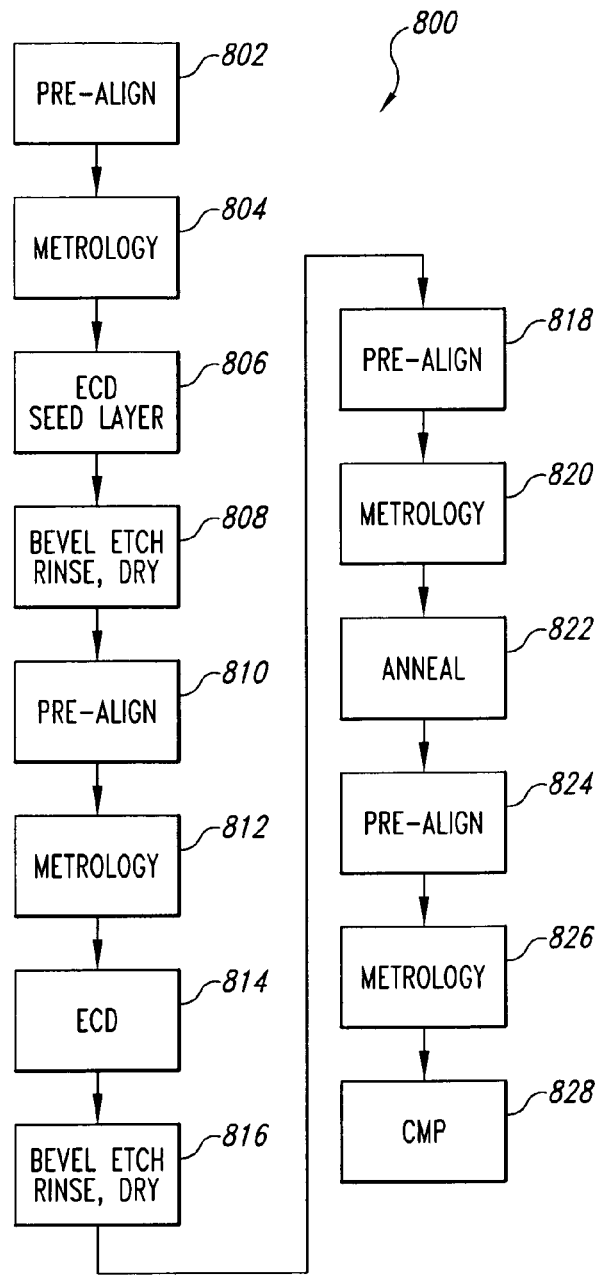
Fig. 7
Fig. 8

APPARATUS AND METHOD FOR PROCESSING A MICROELECTRONIC WORKPIECE USING METROLOGY

CROSS-REFERENCE TO RELATED APPLICATIONS

This application is a continuation of U.S. application Ser. No. 09/612,176 filed Jul. 8, 2000 now U.S. Pat. No. 6,747,734 which is incorporated herein by reference.

STATEMENT REGARDING FEDERALLY SPONSORED RESEARCH OR DEVELOPMENT

Not Applicable

BACKGROUND OF THE INVENTION

The present invention is directed to an apparatus and method for processing a microelectronic workpiece. More particularly, the present invention is directed to an improved apparatus and method of processing a microelectronic workpiece using a metrology result representative of a microelectronic workpiece condition. For purposes of the present application, a microelectronic workpiece is defined to include a microelectronic workpiece formed from a substrate upon which microelectronic circuits or components, data storage elements or layers, and/or micro-mechanical elements are formed.

The fabrication of microelectronic components from a microelectronic workpiece, such as a semiconductor wafer substrate, polymer or ceramic substrate, etc., involves a substantial number of operations performed on the microelectronic workpiece. Such operations include, for example, material deposition, patterning, doping, chemical mechanical polishing, electropolishing, and heat treatment.

Material deposition processing involves depositing or otherwise forming thin layers of material on the surface of the microelectronic workpiece. Patterning provides deposition or removal of selected portions of these added layers. Doping of a microelectronic workpiece such as a the semiconductor wafer, is the process of adding impurities known as "dopants" to the selected portions of the microelectronic workpiece to alter the electrical characteristics of the substrate material. Heat treatment of the microelectronic workpiece involves heating and/or cooling the microelectronic workpiece to achieve specific process results. Chemical mechanical polishing involves the removal of material through a combined chemical/mechanical process, while electropolishing involves the removal of material from a microelectronic workpiece surface using electrochemical reactions.

Production of semiconductor integrated circuits and other microelectronic devices from microelectronic workpieces, such as semiconductor wafers, typically requires the formation and/or electrochemical processing or one or more thin film layers on the microelectronic workpiece. The microelectronic manufacturing industry has applied a wide range of thin film layer materials to form such microelectronic structures. These thin film materials include metals and metal alloys such as, for example, nickel, tungsten, tantalum, solder, platinum, copper, aluminum, gold, etc., as well as dielectric materials, such as metal oxides, semiconductor oxides, and perovskite materials.

Electroplating and other electrochemical processes, such as electropolishing, electro-etching, anodization, etc., have become important in the production of semiconductor integrated circuits and other microelectronic devices from such microelectronic workpieces. For example, electroplating is often used in the formation of one or more metal layers on the microelectronic workpiece. These metal layers are typically used to electrically interconnect the various devices of the integrated circuit. Further, the structures formed from the metal layers may constitute microelectronic devices such as read/write heads, etc.

Electroplated metals typically include copper, nickel, gold, platinum, solder, nickel-iron, etc. Electroplating is generally effected by initial formation of a seed layer on the microelectronic workpiece in the form of a very thin layer of metal, whereby the surface of the microelectronic workpiece is rendered electrically conductive. This electro-conductivity permits subsequent formation of a blanket or patterned layer of the desired metal by electroplating. Subsequent processing, such as chemical mechanical planarization, may be used to remove unwanted portions of the patterned or metal blanket layer formed during electroplating, resulting in the formation of the desired metallized structure.

Electropolishing of metals at the surface of a microelectronic workpiece involves the removal of at least some of the metal using an electrochemical process. The electrochemical process is effectively the reverse of the electroplating reaction and is often carried out using the same or similar reactors as electroplating.

Anodization typically involves oxidizing a thin-film layer at the surface of the microelectronic workpiece. For example, it may be desirable to selectively oxidize certain portions of a metal layer, such as a Cu layer, to facilitate subsequent removal of the selected portions in a solution that matches the oxidized material faster than the non-oxidized material. Further, anodization may be used to deposit certain materials, such as perovskite materials, onto the surface of the microelectronic workpiece.

As the size of various microelectronic circuits and components decreases, there is a corresponding decrease in the manufacturing tolerances that must be met by the manufacturing tools. It is desirable that electrochemical processes uniformly process the surface of a given microelectronic workpiece. It is also desirable that the electrochemical process meet microelectronic workpiece-to-microelectronic workpiece uniformity requirements.

Multiple processes must be executed upon a microelectronic workpiece to manufacture the desired microelectronic circuits, devices, or components. These processes are generally executed in processing tools that are specifically designed to implement one or more of the requisite processes. In order to automate the processing and minimize operator handling, tool architectures have been developed that incorporate multiple processing stations and automated transfer of the microelectronic workpieces from one processing station to the next.

In such tools, the microelectronic workpieces are processed individually at the various processing stations. Furthermore, multiple microelectronic workpieces are concurrently processed at different processing stations. Thus, one microelectronic workpiece may be processed in one of the processing stations while another microelectronic workpiece is concurrently processed in another one of the processing stations. In this way, a pipeline processing approach can be developed, which enhances production throughput. Additionally, processing steps that take longer to perform may have multiple processing stations devoted to performing that particular processing step, thereby enhancing production throughput.

Numerous processing tools have been developed to implement the foregoing processing operations. These tools take on different configurations depending on the type of microelectronic workpiece used in the fabrication process and the process or processes executed by the tool. An exemplary tool embodiment is disclosed in U.S. patent application Ser. No. 08/991,062, filed Dec. 15, 1997, entitled "Semiconductor Processing Apparatus Having Lift and Tilt Mechanism."

One tool configuration, known as the LT-210C™ processing tool and available from Semitool, Inc., of Kalispell, Mont., includes a plurality of microelectronic workpiece processing stations such as one or more rinsing/drying stations, one or more wet processing stations, and one or more thermal processing stations that includes a rapid thermal processing ("RTP") reactor. Such wet processing operations include electroplating, etching, cleaning, electroless deposition, electropolishing, etc.

In the processing of microelectronic workpieces, the output of one process is the input for the next process, and such output typically influences the output of the next process. This is true, for instance, in the case of a copper damascene interconnect process, with the barrier/seed layer process output influencing the output of the copper electrochemical deposition ("ECD") process, or the output of the copper ECD process influences the output of the copper chemical mechanical polishing ("CMP") process. This is also the case in most thin film ECD processes, where the thickness and the thickness uniformity of the seed layer affect the thickness uniformity of the plated film.

The present inventors have recognized the desirability of, in a process having a sequence of steps, automatically adjusting a workpiece processing step to effect its output in response to the output of a prior step or a subsequent step.

SUMMARY OF THE INVENTION

The present invention provides an apparatus and method for processing a microelectronic workpiece, using a metrology measurement of a microelectronic characteristic, such as seed layer thickness or uniformity, measured on a microelectronic workpiece, to influence or control the process. The metrology measurement can be taken subsequent to a prior processing step, i.e., a feed forward control, or subsequent to a process being controlled, i.e., a feed back control. The metrology measurement can be taken on each microelectronic workpiece to be processed, or on a first microelectronic workpiece, or a sample microelectronic workpiece, for a batch of microelectronic workpieces. In general, the invention is useful in situations where a process output affects the output of a subsequent process output in a known manner, or in a manner that can be empirically determined.

When a relationship between a first process output and a subsequent, second process output as described above exists, the second process can be modified in a manner determined by the output of the first process, in order to ensure that the output from the second process is as desired (e.g. as uniform and repeatable as possible), regardless of variation in the output of the first process. The desired output could be different than merely trying to produce uniform results, however; for example, it is possible that intentional variation in one parameter (e.g. film thickness) could be introduced in order to compensate for another non-uniformity (e.g. line width) to produce uniform electrical results. Furthermore, a measurement of the output of the first process can be incorporated into the apparatus that performs the second process, and the data from this measurement can be used as an input to a mathematical algorithm that is used to tune the second process.

The apparatus of the invention can include a control that modifies the process parameters of a process in order to compensate for material variations in the incoming microelectronic workpiece, in order to produce a uniform output or desired output from the process. The material variations in the microelectronic workpiece fed to this second process could be due to variability in a prior process step or to the use of different operations or processing chambers to feed the process. The apparatus of the invention can include an in-line metrology measurement system to determine the condition of the incoming microelectronic workpiece material, and a control for altering the process conditions based on the measurement results, i.e., a feed forward control. The metrology system may additionally be used to measure the output of the process as well. Alternately, the metrology system can measure the output of the process and the control can alter the process conditions of subsequently processed microelectronic workpieces, i.e., a feed back control.

According to one exemplary aspect of the invention, metrology integration and ECD seed layer integration are utilized. The metrology integration, either physical or virtual through a network link, allows dynamic control of the process. The ECD seed layer integration allows clustered processing which lowers costs and facilitates "split lot" processing, i.e., differing process recipes, for two or more groups of workpieces within a batch.

The invention can be advantageously configured in a high volume manufacturing configuration or a process development configuration.

According to the high volume configuration, such as for an ECD tool, the tool preserves high volume ECD capability while also adding a "repair or recovery" mode to maintain the finished plating integrity. Under normal operation, the tool may be used with or without periodic verification through in-line metrology.

The metrology system can be used to measure the first workpiece of a lot, or to measure from a specific process location of the prior step (e.g., a given chamber on a seed layer sputtering tool) to verify good incoming quality of seed layers or other parameters. Likewise, the metrology system can feed forward or feed back uniformity and thickness data to drive the process recipe for electroplating reactors.

The metrology system of the invention is particularly useful in the case of reactors having the advantageous ability to manipulate wafer uniformity through process recipe control. The reactors can be adjusted to varied electrochemical processing requirements, such as in response to metrology data, to provide a controlled, substantially uniform diffusion layer and electrical potential at the surface of the microelectronic workpiece that assists in providing a corresponding substantially uniform processing of the microelectronic workpiece surface (e.g., uniform deposition of the electroplated material). Such electrochemical processing techniques can be used in the deposition and/or alteration of blanket metal layers, blanket dielectric layers, patterned metal layers, and patterned dielectric layers.

The process and apparatus can be controlled with increased versatility when using the metrology data. Based upon the output from the metrology unit, the user can decide to stop the subsequent process to resolve the issues driving the prior process. For example, an electroplating process can be stopped when seed layer thicknesses are below acceptable tolerances. Alternately, the user can continue the subsequent processing and adjust the subsequent process steps or process parameter based upon the output from the metrology unit. For example, where seed layer thickness or uniformity is unacceptable, the user can insert an intermediate step and automatically "fix" a seed layer problem with a seed layer enhancement process, such as an electrochemical deposition (ECD) seed layer enhancement process. The user can also continue the processing and automatically adjust the process recipe on ECD reactors to achieve acceptable plating uniformity and thickness. Also, rather than attempt to fix or compensate for a seed layer non-uniformity, a rejected workpiece can be recovered in a non-compliance station, or sent first to a stripping unit to have the nonconforming layer removed and then sent to the non-compliance station. Microelectronic workpieces stored in the non-compliance station can be removed from the apparatus for recovery (reuse).

Furthermore, the apparatus of the invention is easily configured for high volume manufacturing with ECD seed layer enhancement integrated as part of the standard process, irrespective of the presence of seed layer non-uniformity. The number of ECD seed layer chambers can correlate to the throughput requirement. As dual damascene features continue to become more aggressive, the capability of physical vapor deposition ("PVD") to conformably deposit the requisite seed layer in these features becomes limited. The ECD seed layer is a promising approach to extend ECD processes beyond the limits of current PVD technology.

An alternate exemplary embodiment of the tool incorporating the present invention is a process development configuration. This tool design is directed to developing optimized processes. The configuration allows a wide range of flexibility in process sequence and control. For example, a process engineer might want to measure incoming seed layer thickness, ECD seed layer deposition results, ECD fill results, and post annealing results. Since the plating solution reservoirs can be much smaller, the user may also quickly and easily interchange chemistries for rapid and low-cost experimentation. The user may want to run split lots with a wide variety of process combinations to determine feasibility of a production process.

The invention can be applied to a chemical mechanical polishing ("CMP") tool. For example, metrology can be used to adjust the polishing recipe of the CMP tool based on feed forward data on incoming film thickness, or feed back data from a workpiece measured subsequent to the CMP process.

A further alternate embodiment of the invention is an integrated metrology system for a multi-tool apparatus. The apparatus can, for example, include a seed layer tool, an electrochemical deposition tool, and a chemical mechanical polishing tool. At least one metrology unit is utilized which communicates with a control to influence process recipes or process step sequence on one or more of the tools. Each tool can have a dedicated metrology unit to measure incoming material or output results. The metrology results or data can be fed forward or fed back to the respective other tools to control or otherwise influence the process of the other tools.

Numerous other advantages and features of the present invention will become readily apparent from the following detailed description of the invention and the embodiments thereof, from the claims and from the accompanying drawings.

BRIEF DESCRIPTION OF THE DRAWINGS

FIG. 7 is a block diagram of a sequence of processing steps in accordance with a third method of the present invention;

FIG. 8 is a block diagram of a sequence of processing steps in accordance with a fourth method of the present invention;

DETAILED DESCRIPTION OF THE INVENTION

Figure 1:
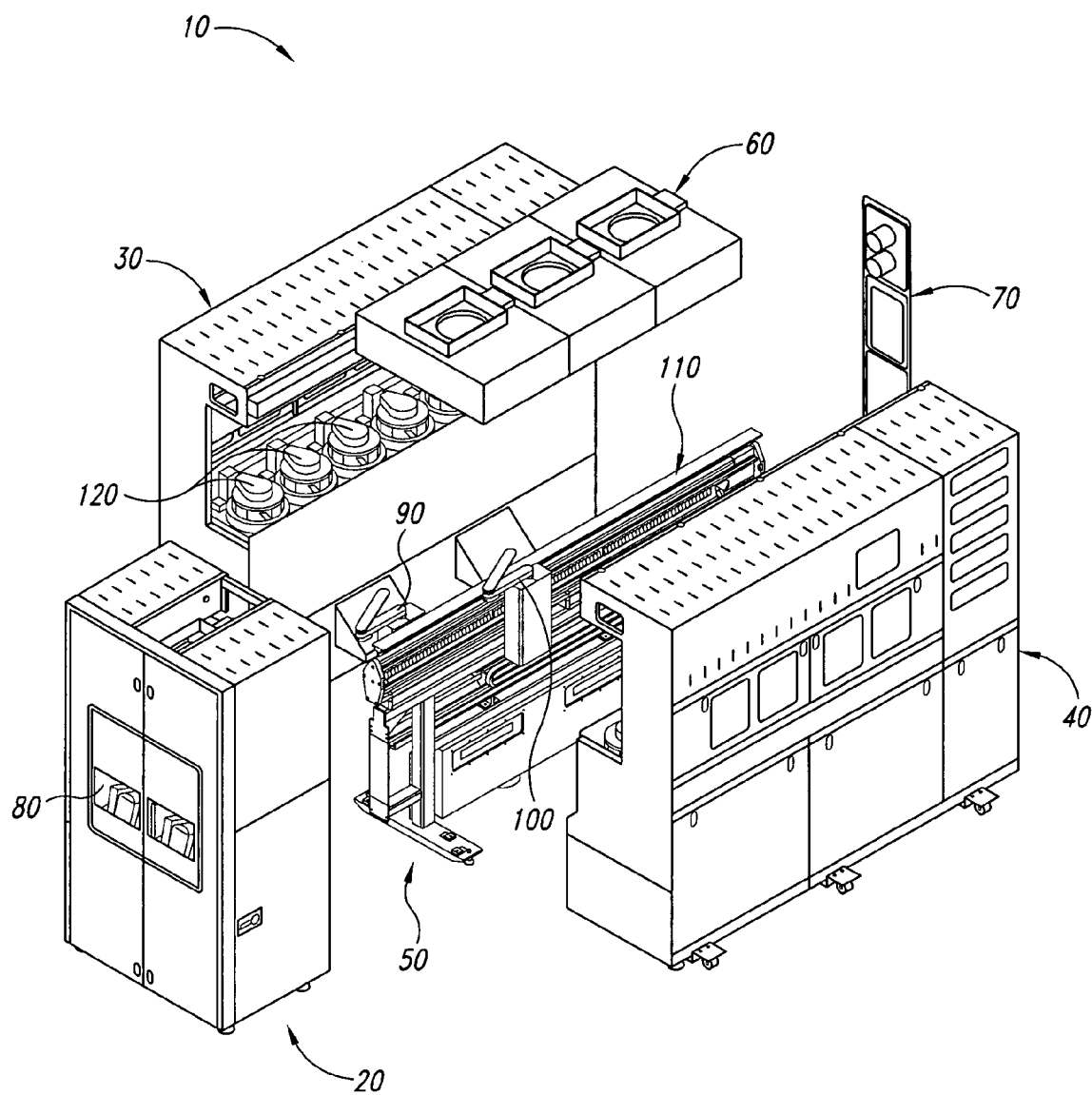
FIG. 1 is an exploded isometric view of a prior art processing tool.

While this invention is susceptible of embodiment in many different forms, there are shown in the drawings and will be described herein in detail, specific embodiments thereof with the understanding that the present disclosure is to be considered as an exemplification of the principles of the invention and is not intended to limit the invention to the specific embodiments illustrated.

Systems

Integrated Processing Tool

FIG. 1 is an exploded isometric view of a prior art integrated microelectronic workpiece-processing tool 10. This exemplary tool embodiment is disclosed in U.S. patent application Ser. No. 08/991,062, filed Dec. 15, 1997, entitled "Semiconductor Processing Apparatus Having Lift and Tilt Mechanism."

Although modularity is not necessary to the overall tool function, the tool 10 is shown as having been separated into individual modular components. The exemplary integrated microelectronic workpiece processing tool 10 of FIG. 1 comprises an input/output section 20, a processing section including first and second processing subsections 30 and 40, a microelectronic workpiece transfer apparatus 50, an exhaust assembly 60, and an end panel 70.

The input/output section 20 includes an opening 80 through which one or more cassettes can be received or removed. Generally stated, cassettes that are received at the input/output section 20 include microelectronic workpieces that are to be processed within the tool 10, while cassettes that are removed from the input/output section 20 include microelectronic workpieces that have already been processed within the tool 10. However, it will be recognized that a processed microelectronic workpiece may be returned directly to the cassette from which it was respectively provided to the tool.

In the embodiment of FIG. 1, the cassettes are received directly by one or more direct-access assemblies that, in turn, allow direct access to individual microelectronic workpiece slots of the cassettes. For example, in the specific tool shown here, the cassettes are directly received by and removed from one or more direct-access assemblies. The direct-access assemblies of the illustrated embodiment are constructed as lift/tilt assemblies that both lift the cassette and reorient it for presentation to a subsequent microelectronic workpiece transfer assembly. When the lift/tilt assemblies initially receive the cassettes, the microelectronic workpieces are in a first position with respect to horizontal, such as a substantially vertical position. Each lift/tilt assembly then reorients (i.e. tilts) the respective cassette to a second position with respect to horizontal, such as a microelectronic workpiece horizontal position. Each lift/tilt assembly is used to position the respective microelectronic workpiece cassettes to an orientation in which the microelectronic workpiece holding positions, such as microelectronic workpiece slot positions, of the cassette are individually accessible. While oriented in this second position, the microelectronic workpiece slots and corresponding microelectronic workpiece, if any, of each cassette are therefore generally accessible to the microelectronic workpiece transfer apparatus 50. In the illustrated tool, microelectronic workpiece transfer apparatus 50 includes one or more microelectronic workpiece transport units 90 and 100. The microelectronic workpiece transport units 90 and 100 may be used to transport individual microelectronic workpieces along the conveyor path 110, between the cassettes and one or more processing stations 120 of processing subsections 30 and 40 and, further, may be used to transport microelectronic workpieces between individual processing stations 120. The various sections of the integrated microelectronic workpiece processing tool 10 may define an enclosed space that is generally separate from the external environment. To this end, exhaust assembly 60 enables venting of airborne contaminants initially present or produced during processing of the microelectronic workpieces to thereby generate and/or maintain a relatively clean processing environment within the enclosed space.

After the microelectronic workpieces are processed, the transfer apparatus 50 places the microelectronic workpieces into a cassette, and the cassette containing the processed microelectronic workpieces are removed from the integrated microelectronic workpiece-processing tool 10 via the opening 80 in the input/output section 20.

Metrology Controlled Processing Tool

Figure 2:
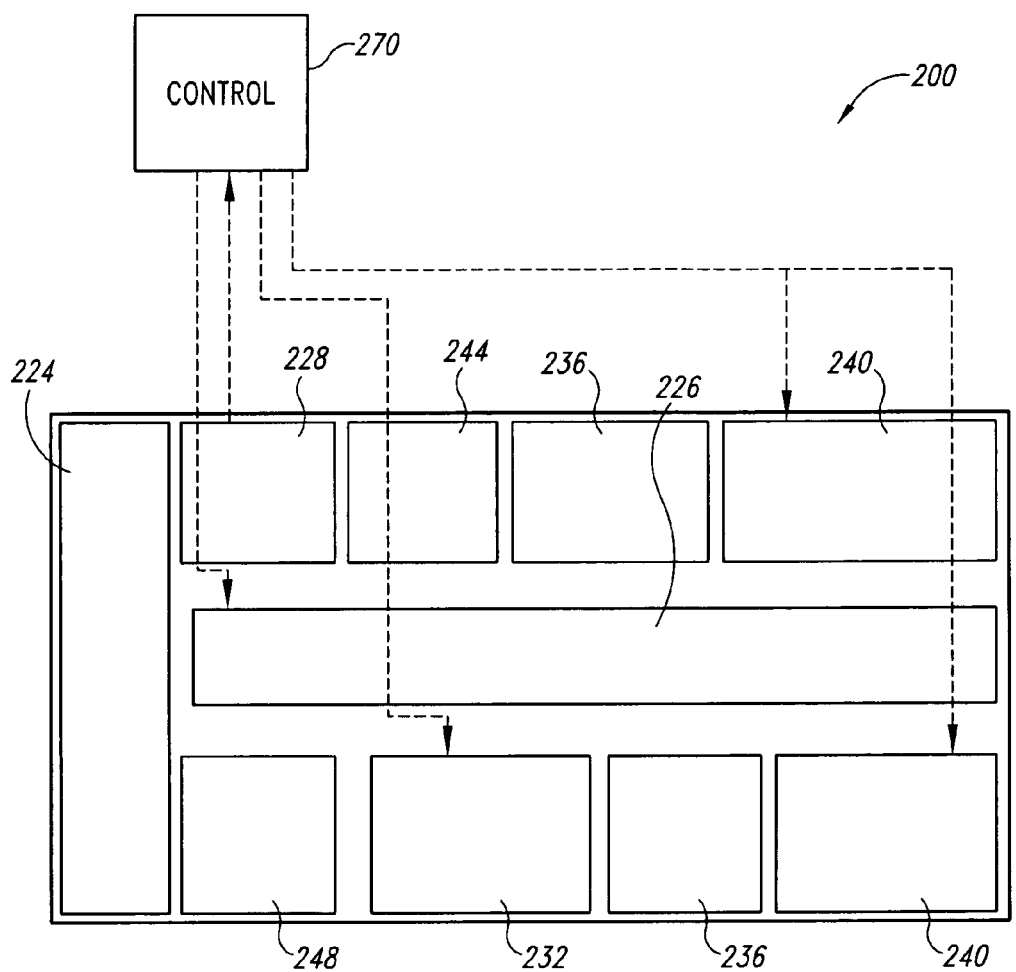
FIG. 2 is a schematic plan view of a microelectronic workpiece processing apparatus of the present invention.

FIG. 2 illustrates in schematic fashion a processing tool 200 of the present invention, which is similar to the tool shown in FIG. 1 except as noted. The tool 200 includes an input/output station 224 at one end, a linear conveyor arrangement or linear robot 226 extending from the input/output station along a length of the tool 200, and a number of processing stations. The processing stations can include a metrology unit 228, one or more ECD seed layer enhancement units 232, one or more stripping units 236, and one or more plating units 240. Additionally, the tool 200 includes one or more annealing units 244 and a non-process station or staging station 248.

The linear robot 226 includes a rail 250 (FIG. 3) which extends substantially the length of the processing units, and which carries a robot arm manipulator or transport unit 256 thereon. The robot arm manipulator 256 can remove a wafer from the input/output station 224 and deliver the microelectronic workpiece to and from any of the processing units 232, 236, 240, 244 or to and from the metrology unit 228 and to and from the non-process station 248.

In one mode of operation, the in-film metrology unit 228 measures a seed layer thickness or uniformity on a workpiece and communicates the data to a controller 270. The controller can be a programmable controller. Based on the data, decisions concerning the process parameters or recipe downstream from the metrology unit are made. The process recipe for one or more downstream units can be modified based on the metrology results. Alternatively, or additionally, the process sequence can be modified according to the metrology results. For example, if the seed layer thickness or uniformity is insufficient, or less than a tolerance value, the microelectronic workpiece can be delivered to one of the seed layer enhancement units 232 before being delivered to one of the electroplating units 240. Alternatively, if the seed layer is defective or has a thickness out of tolerance by an unacceptable amount, such that the seed layer cannot be repaired or enhanced in the seed layer enhancement unit 232, the microelectronic workpiece can be delivered to one of the stripping units 236 wherein the microelectronic workpiece can be etched, including its process side surface and beveled edge, to be thereafter delivered by the manipulator 256 to the non-process station 248. The non-process station can be a non-compliance station, including a cassette 248*a* for holding microelectronic workpieces for returning microelectronic workpieces to a seed layer application station, typically a physical vapor deposition (PVD) apparatus external to the described tool 200. After the microelectronic workpiece has been plated according to the process recipe in one of the electroplating units 240, it can be delivered to the in-line anneal unit for annealing, and thereafter delivered to the input/output station 224 for exporting to a next process tool.

High Throughput Embodiment

Figure 3:
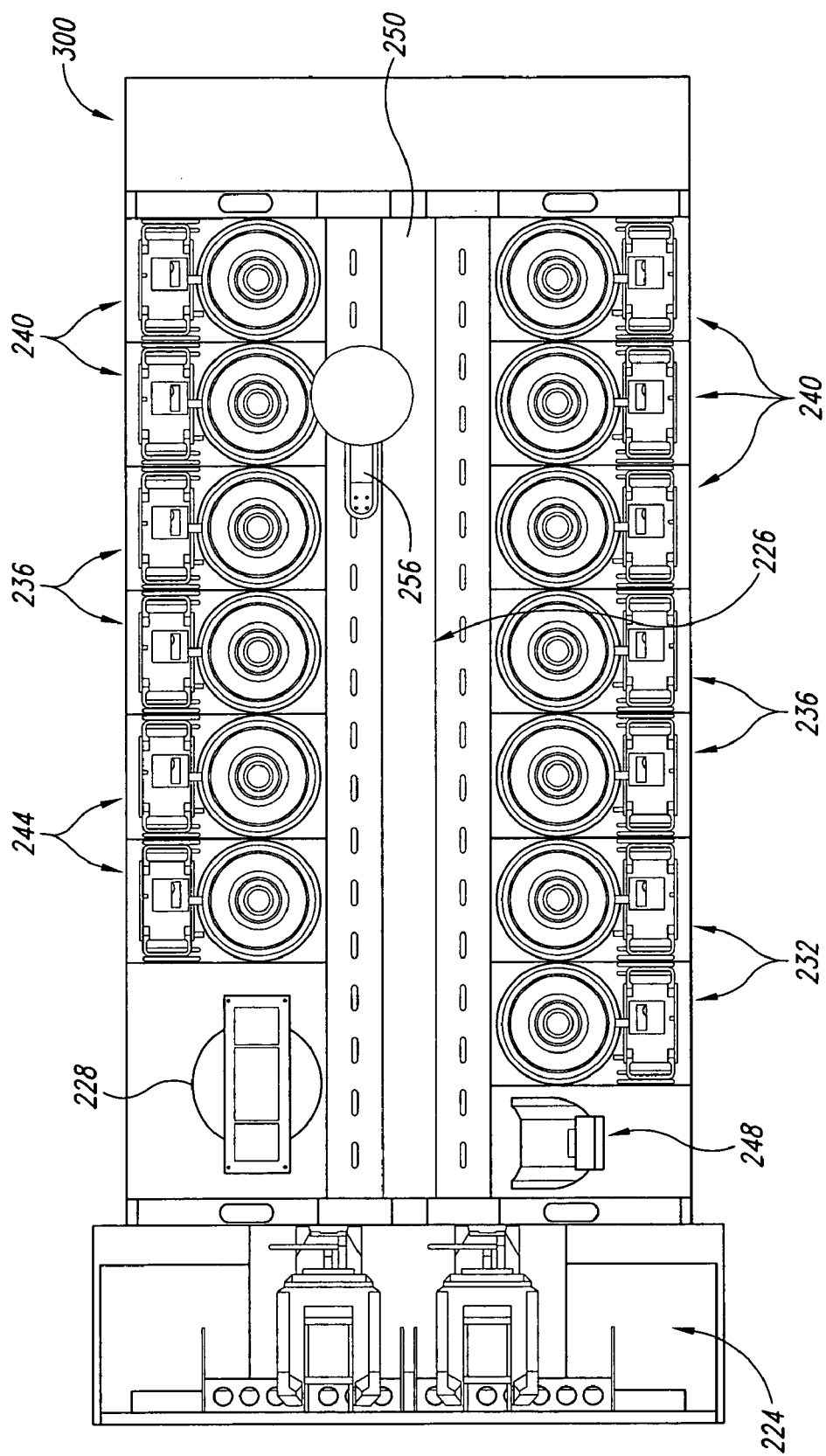
FIG. 3 is a schematic plan view of a first embodiment of the present invention.

A high volume or high throughput tool 300 is illustrated in FIG. 3. According to the high volume configuration, the tool preserves high volume ECD capability while also adding a "repair or recovery" mode to maintain the finished plate integrity. Under normal operation, the tool may be used with or without periodic verification through in-line metrology at the metrology unit 228.

The metrology unit can be used to measure the first substrate of a lot, or from a specific process location of the prior step (e.g., a given chamber on a seed layer sputtering tool) to verify good incoming quality of seed layers or other parameters. Likewise, the metrology unit can feed forward or feed back uniformity and thickness data to drive the process recipe for the electroplating reactors 240.

The electroplating units 240 are preferably adjustable reactors (described below) or other type reactors that can adapt to varied electrochemical processing requirements while concurrently providing a controlled, substantially uniform diffusion layer and electrical potential at the surface of the microelectronic workpiece that assists in providing a corresponding substantially uniform processing of the microelectronic workpiece surface (e.g., uniform deposition of the electroplated material). The electroplating units 240 can be controlled by the controller 270 (FIG. 2) to compensate for non-uniformities of the seed layer determined by the metrology unit. Such electrochemical processing techniques can be used in the deposition and/or alteration of blanket metal layers, blanket dielectric layers, patterned metal layers, and patterned dielectric layers.

The tool 300 can be controlled with increased flexibility when using the metrology unit. Based upon an output from the metrology unit 228 derived from the programmable recipe from the metrology unit 228, the user can decide to stop the subsequent microelectronic workpiece processing, such as the electroplating units 240, and resolve the issues driving the prior process, such as a seed layer deposition process. For example, the electroplating process can be stopped where seed layer thicknesses are below acceptable tolerances.

Alternately, the user can continue the subsequent processing and adjust the order of subsequent process steps, or insert a remedial process step, based upon the output from the metrology unit. For example, the user can first transport the wafer to a seed layer enhancement unit 232 to automatically "fix" or adjust a seed layer problem with the ECD seed layer enhancement process and then transport the microelectronic workpiece to an electroplating unit 240.

Rather than changing the order of the process steps or inserting an intermediate step, the user can also continue the processing and automatically adjust the process recipe in the electroplating unit 240, particularly using variable recipe reactors, for enhanced plating uniformity and thickness.

Still further, if a microelectronic workpiece seed layer is too far out of tolerance in thickness or uniformity, the microelectronic workpiece can be transported to one of the stripping units 236 where the microelectronic workpiece processing side is stripped. The microelectronic workpiece can then be transported to the non-compliance station 248, particularly to the cassette 248a, for recycling.

The tool 300 is also easily configured for high volume manufacturing with ECD seed layer enhancement integrated as part of the standard process, i.e., the number of ECD seed layer enhancement chambers 232 can correlate with the throughput requirement.

The stripping units 236 can also be used to clean copper contamination from the prior PVD seed layer process from the microelectronic workpiece back, edge and bevel to eliminate problems during chemical mechanical polishing (CMP).

The tool 300 can also include a microelectronic workpiece pre-aligner (not shown). The pre-aligner is described in "Semiconductor Processing Apparatus Having Lift And Tilt Mechanism", U.S. Ser. No. 08/991,062 filed Dec. 15, 1997, and is used to rotationally align microelectronic workpieces initially for precise processing. This is particularly important given the fact that the metrology unit can be utilized for measuring precise points in patterned film layers, i.e., accurate positioning of the microelectronic workpiece is important to obtain an accurate reading.

Process Development Embodiment

Figure 4:
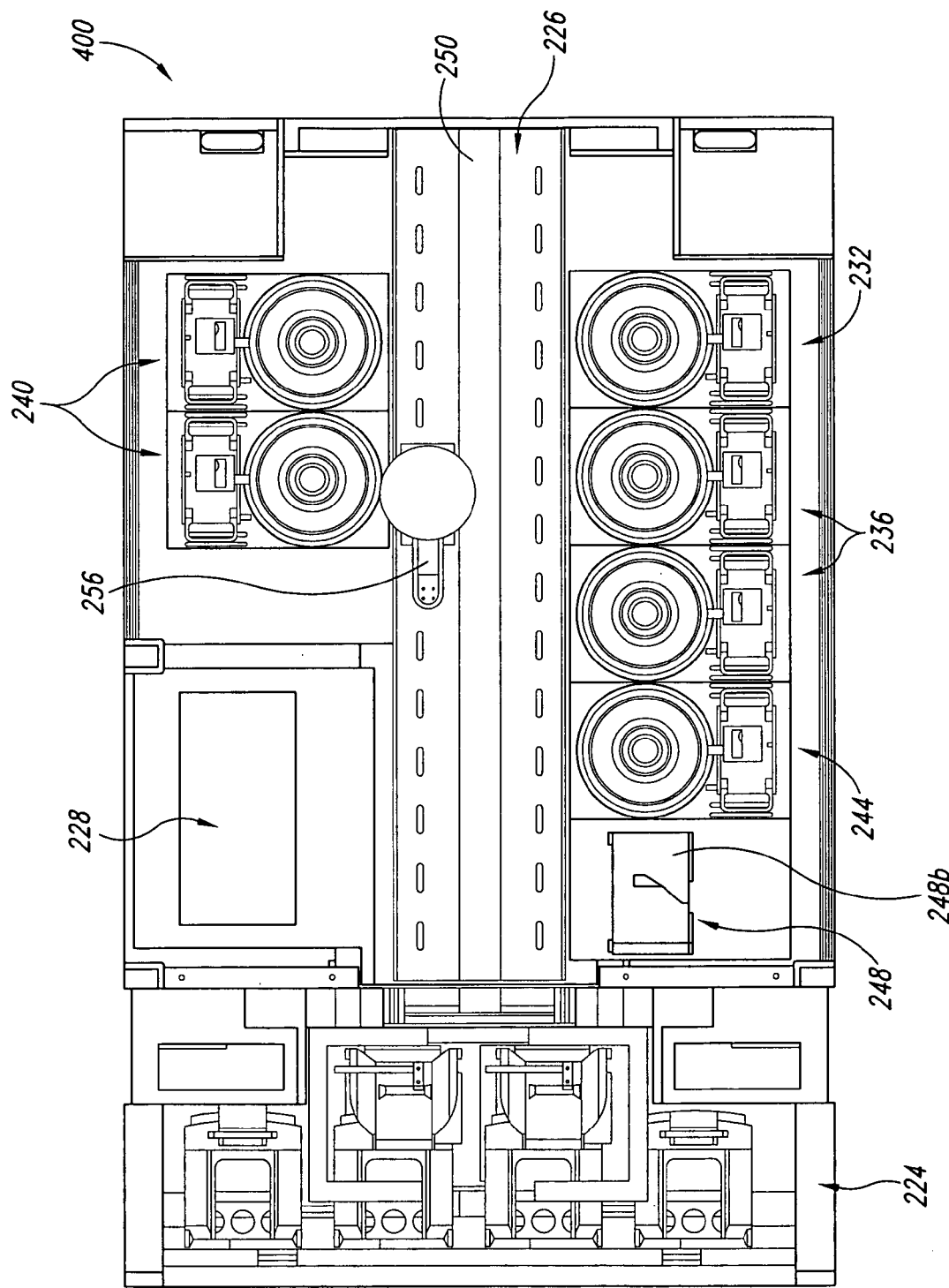
FIG. 4 is a schematic plan view of a second embodiment of the invention.

An alternate exemplary embodiment of the tool incorporating the present invention is a process development configuration tool 400 illustrated in FIG. 4. This tool 400 is directed to developing optimized processes, i.e., for research and development. The tool 400 has a compact layout. The tool configuration allows increased flexibility in process sequence and control. For example, a process engineer might want to measure any combination of incoming seed layer thickness, ECD seed layer deposition results, ECD fill results, and post annealing results. Since the plating solution reservoirs can be much smaller, the user may also quickly and easily interchange chemistries for rapid and low-cost experimentation. The user may want to run split lots with a wide variety of process combinations to determine feasibility of a production process.

The tool 400 includes fewer processing stations than the tool 300 shown in FIG. 3. The tool 400 includes two electroplating units 240, an in-line metrology unit 228, an annealing unit 244, a seed layer enhancement unit 232, and two stripping and/or cleaning units 236 for stripping films or backside cleaning as needed. The tool 400 also includes a staging station 248, in this case configured as a wafer pre-aligner 248b.

Process Sequences

FIGS. 5 through 8 illustrate different process sequences which can be employed according to the invention. The process sequences are examples, and the process order can in some cases be rearranged, and process steps can be eliminated or added without departing from the invention.

Figures 5, 6:
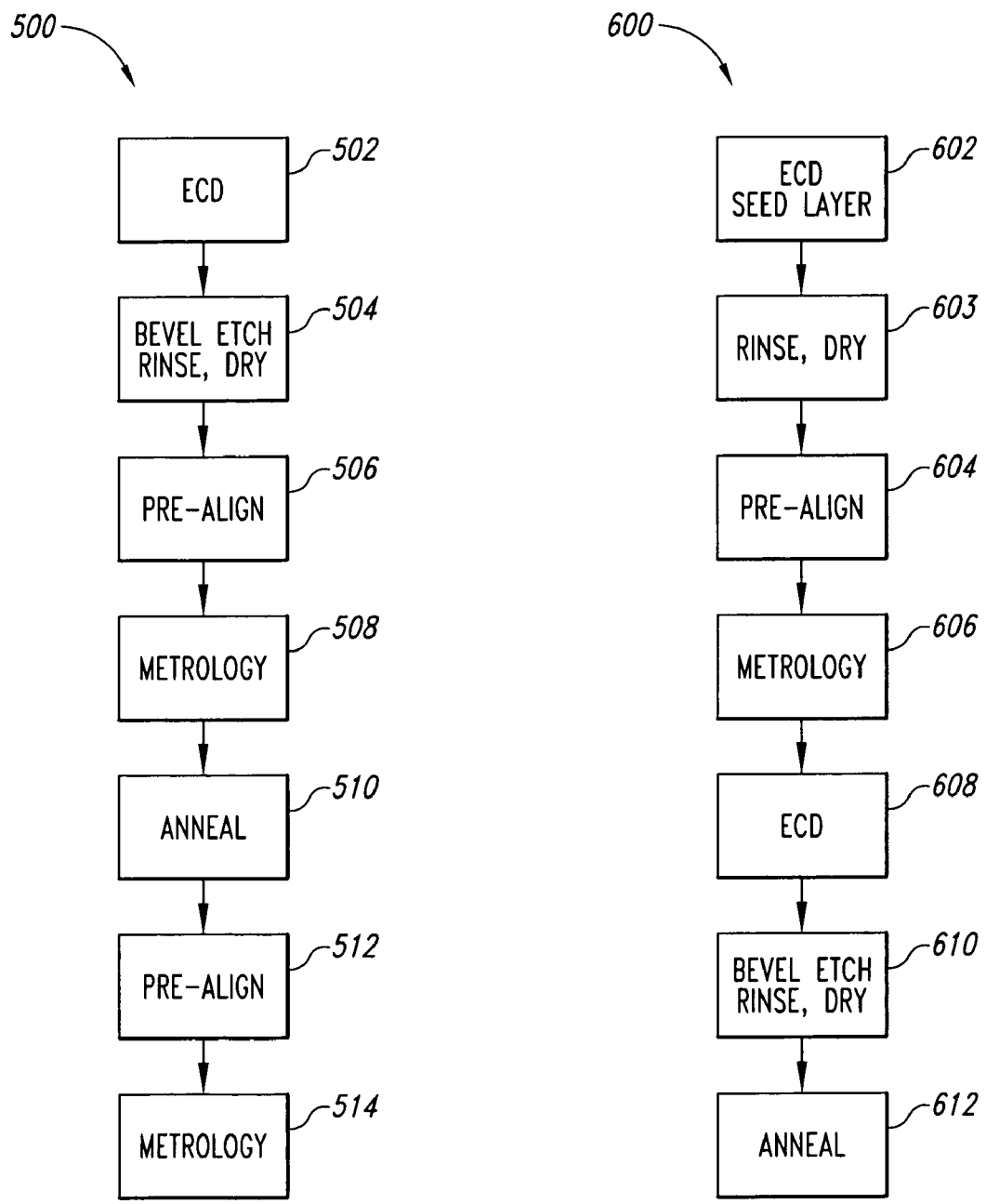
FIG. 5 is a block diagram of a sequence of processing steps in accordance with a first method of the present invention.
FIG. 6 is a block diagram of a sequence of processing steps in accordance with a second method of the present invention.

FIG. 5 illustrates a first process sequence wherein the microelectronic workpiece is first processed in an ECD unit such as an electroplating unit in a first step 502. Subsequently the workpiece is transferred to a stripping unit and the workpiece is bevel-etched, rinsed and dried in a step 504.

Subsequent to the step 504 the workpiece is transferred to a pre-align station to be accurately positioned, in step 506. The microelectronic workpiece is then transported to the metrology unit in a step 508 and film thickness and/or other parameters are measured. In a step 510 the workpiece is annealed in a annealing unit. The workpiece is thereafter transported to be pre-aligned in a step 512 for accurate reference position. In a step 514 the workpiece is transported to the metrology unit to have parameters such as post annealing film thicknesses measured. The pre-align unit can be incorporated into the metrology unit which would eliminate the need to transport the workpiece to and from a pre-align unit. The metrology data derived from steps 508 and 514 can be used to feed back control information, for example, to the ECD (step 502) for controlling process recipe for subsequent workpieces.

FIG. 6 illustrates a second sequence of process steps including a first step 602 in which a microelectronic workpiece has a seed layer applied by an ECD reactor. The workpiece is then transported to a rinse and dry station in a step 603 and then to a pre-align station for accurate positioning in a step 604. The workpiece is then transported to a metrology unit in a step 606 for parameter measurements, such as film thickness. In the step 608 the workpiece is then transported to the ECD unit, such as an electroplating unit, to be further processed. In a step 610 the workpiece is then transported to a stripping unit for bevel etch, rinse and dry processing. Subsequently, in a step 612 the microelectronic workpiece is annealed.

The metrology measurement taken in step 606 can be used to control the recipe of the downstream ECD reactor (step 608).

FIG. 7 illustrates a third sequence of process steps 700 which commences with a pre-align of the workpiece in step 702. The workpiece is then transported to the metrology unit for accurate measuring in a step 704. A barrier layer can be measured in this step. Subsequent to the step 704 the workpiece is transported to an ECD seed layer unit for the deposition of a seed layer onto the workpiece. The workpiece is then transported to a rinse and dry station in a step 707, and then to the pre-align station in a step 708, for accurate reference positioning. The workpiece is then transported back to the metrology unit 710 in a step 710 for accurate measuring of the applied seed layer, for example. After the metrology measurements are taken, the workpiece is transported to an ECD unit, such as an electroplating unit, in a step 712 and a further processing of the workpiece ensues. Upon completion of the ECD processing the workpiece is transported to a stripping unit for a bevel etch rinse and dry in a step 714. The workpiece is then transported to an annealing unit in a step 716 and the workpiece is annealed.

The metrology measurements taken in steps 704 and 710 can be used to control the recipe in steps 706 and/or 712 as a feed forward or feed back control.

FIG. 8 illustrates a fourth process sequence of steps 800 which commences at a step 802 with pre-aligning the microelectronic workpiece. The workpiece is then transported to the metrology unit for measurements in a step 804. The workpiece is subsequently transported to and ECD seed layer unit wherein a seed layer is applied to the workpiece in a step 806.

After the seed layer is applied, the workpiece is transported to a bevel etch rinse and dry station in a step 808. The workpiece is then transported back to the pre-align station to be accurately reference positioned in a step 810. After being accurately positioned the workpiece is transported to the metrology unit for further accurate measurements in step 812. The workpiece is thereupon transported to an ECD unit such as an electroplating reactor, wherein further processing of the workpiece ensues in a step 814. After such processing, the workpiece is transported to the bevel etch, rinse and dry station and processed accordingly in a step 816.

The workpiece is then transported to a pre-align station and accurately positioned in a step 818. After being accurately positioned, the workpiece is returned to the metrology unit and in a step 820 is accurately measured. The workpiece is then transported to an annealing unit in a step 822 and is annealed.

After annealing, in a step 824 the workpiece is transported to a pre-align station and is accurately reference positioned. After being accurately positioned, in a step 826 the workpiece is transported back to the metrology unit and accurately measured. In a step 828, the workpiece is transported to a chemical mechanical polishing unit ("CMP") for further processing.

The metrology steps 804, 812, 820 and/or 826 can be utilized to feed forward or feed back control of process recipes or control step sequences.

It should be noted that in FIGS. 5, 6, 7, and 8 the pre-align steps are optional depending on the tool configuration.

Multi-Tool Integrated Metrology Systems

Figure 9:
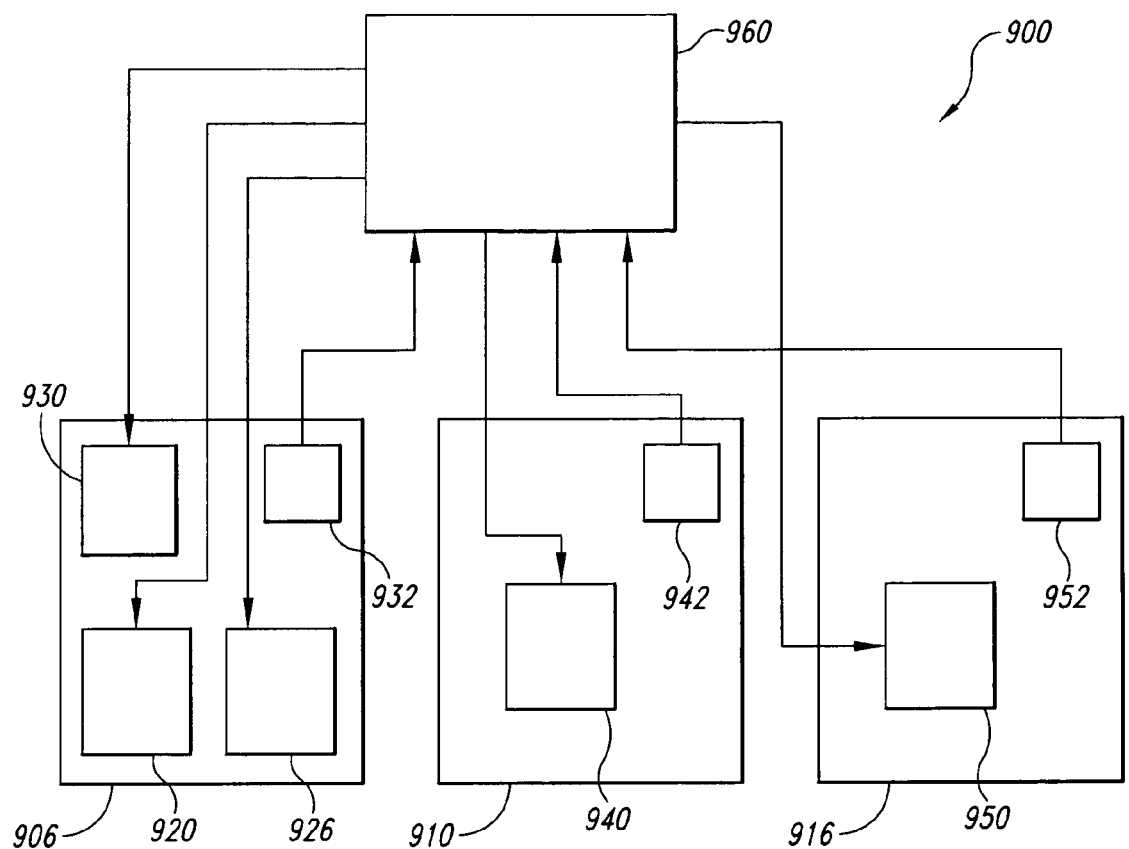
FIG. 9 is a schematic plan view of an alternate embodiment microelectronic workpiece processing apparatus of the present invention.

FIG. 9 illustrates an alternate embodiment system 900 for processing a microelectronic workpiece. The system 900 includes a seed layer tool 906, an ECD tool 910, and a chemical mechanical polishing tool 916.

The seed layer tool 906 includes a barrier deposition station 920 and a seed layer deposition station 926. The seed layer tool 920 can also include a cleaning station 930 such as is generally known in the art. A metrology unit 932 can be incorporated as part of the seed layer station for in-line metrology monitoring.

The ECD tool 910 can be configured as the tools 200, 300, 400, and includes an ECD station 940, such as an electroplating unit 240. The ECD tool 910 can also include a metrology unit 942 for in-line metrology monitoring.

The chemical mechanical polishing tool 916 can include a chemical mechanical polishing station 950 and an in-line metrology unit 952 for in-line metrology monitoring.

After layers are formed on the microelectronic workpiece, there is a need to planarize the surface of the workpiece. One method of planarizing is chemical mechanical polishing ("CMP"). According to this method, the workpiece is mounted to a carrier or polishing head. The workpiece is placed against a rotating polishing pad. A polishing-slurry, including at least one chemically reactive agent, is supplied to the surface of the pad.

Chemical mechanical polishing must be carefully controlled to polish the workpiece to a desired flatness or thickness to reach the polishing endpoint. Process variations in the initial thickness of the layer to be polished, the slurry composition, the polishing pad condition, the relative speed between the pad and the workpiece, and the pad load on the workpiece, can cause variations in the material removal rate or polishing rate. The polishing time to reach the polishing endpoint is thus a process variable.

A controller 960 can be provided to coordinate the processing of the workpiece as it progresses from the seed layer tool 906 to the ECD tool 910 to the chemical mechanical polishing tool 916. The controller can be a programmable controller. The metrology units 932, 942, 952 can be configured to send measurement data to the controller 960. The controller 960 can control the process recipes or the sequence of process steps on the three tools 906, 910, 916 based on the metrology results from one or more of the metrology units 932, 942, 952.

For example, a metrology result from the metrology unit 932 of the condition of the seed layer applied sequentially by the barrier deposition station 920 and by the seed layer deposition station 926 can be used to control the process recipe in the ECD station 940 and/or the process recipe in the CMP tool 916. In the CMP tool, the polishing time, the rotational speed of the workpiece or pad, the pressure exerted by the pad on the workpiece, and the radial distribution of pad pressure on the workpiece can be process recipe variables which could be controlled or adjusted. If the film to be polished is center thick, the CMP process may be tuned to polish the center faster.

Also as examples, the metrology result from the metrology unit 952 could be used as feedback to control the process recipes on any of the tools 906, 910, 916. The metrology result from the metrology unit 942 could be used as feed back to control the process recipe in the seed layer tool 906 and/or as feed forward to control the process recipe in the chemical mechanical polishing tool 916.

These configurations are exemplary only, and those skilled in the art will recognize a separate metrology station in lieu of units 932, 942 and 952 to effect process parameter control.

Figure 10:
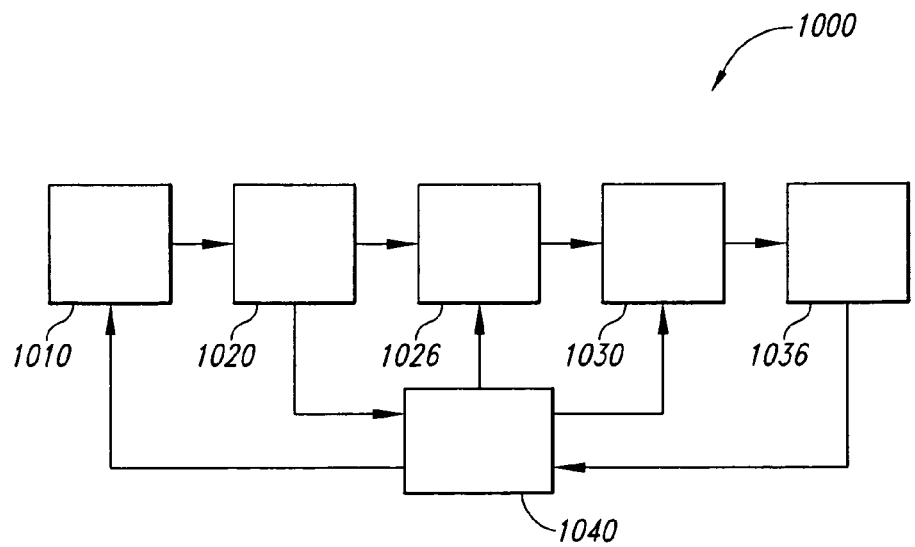
FIG. 10 is a schematic plan view of a further alternate embodiment microelectronic workpiece processing apparatus of the present invention.

FIG. 10 illustrates another multi-tool or multi-station system 1000 wherein metrology control can be used. A photoresist deposition station 1010 applies photoresist to a workpiece. The workpiece photoresist layer thickness can then be measured by a methology unit 1020. The workpiece is then exposed in a photoresist exposure station 1026 and then developed in a photoresist develop station 1030. A further metrology unit 1036 can then measure the workpiece layer thickness, or pattern dimension. Through a controller 1040, the metrology unit 1020 can feed forward to control the photoresist develop station 1026 or feed back to control the photoresist deposition station 1010. The further metrology unit 1036 can feed back to control the photoresist develop station 1030, via the controller 1040. The controller can be a programmable controller.

Components

Electroplating Units

The electroplating units 240, 940 of the tools 200, 300, 400, 910 each include a plating reactor such as described in "Improved Anode Assembly For Electroplating Apparatus", U.S. Ser. No. 09/112,300 filed Jul. 9, 1998, or an adjustable plating reactor as described in "Workpiece Processor Having Processing Chamber With Improved Processing Fluid Flow", PCT/US00/10210 filed Apr. 13, 2000 or "System For Electrochemically Processing A Workpiece", PCT/US00/10120 filed Apr. 13, 2000, WO 00/14308 Mar. 16, 2000, all herein incorporated by reference. Alternate reactor types are described in WO 00/20663, published Apr. 13, 2000; WO 99/10566, published Mar. 4, 1999; WO 99/54527, published Oct. 28, 1999; WO 99/54920, published Oct. 28, 1999; and WO 99/25904, published May 27, 1999, and are encompassed by the invention.

Preferably, the plating reactor is an adjustable reactor (as referenced above) that includes a processing container for providing a flow of a processing fluid during immersion processing of at least one surface of a microelectronic workpiece. The processing container comprises a principal fluid flow chamber providing a flow of processing fluid to at least one surface of the microelectronic workpiece. The fluid flow inlets are arranged and directed to provide vertical and radial fluid flow components that combine to generate a substantially uniform normal flow component radially across the surface of the microelectronic workpiece.

The reactor comprises a reactor head including a microelectronic workpiece support that has one or more electrical contacts positioned to make electrical contact with the microelectronic workpiece. A plurality of anodes are disposed at different elevations in the principal fluid flow chamber so as to place them at different distances from a microelectronic workpiece under process. One or more of the plurality of anodes may be in close proximity to the microelectronic workpiece under process. Still further, one or more of the plurality of anodes may be a virtual anode. The anodes used in the electroplating reactor can be placed in close proximity to the surface of the microelectronic workpiece to thereby provide substantial control over local electrical field/current density parameters used in the electroplating process. This substantial degree of control over the electrical parameters allows the reactor to be readily adapted to meet a wide range of electroplating requirements (e.g., seed layer thickness, seed layer type, electroplated material, electrolyte bath properties, etc.) without a corresponding change in the reactor hardware. Rather, adaptations can be implemented by altering the electrical parameters used in the electroplating process through, for example, software control of the power provided to the anodes.

Advantage can be taken of this increased control to achieve greater uniformity of the resulting electroplated film. Such control is exercised, for example, by placing the electroplating power provided to the individual anodes under the control of a programmable controller or the like. Adjustments to the electroplating power can thus be made subject to software control based on a metrology-based signal, based on seed layer thickness, for example.

It will be recognized that the particular currents that are to be provided to the anodes depends upon numerous factors including, but not necessarily limited to, the desired thickness and material of the electroplated film, the thickness and material of the initial seed layer, the distances between anodes and the surface of the microelectronic workpiece, electrolyte bath properties, etc.

Although the aforementioned adjustable reactor controls electroplating power to individual anodes, other methods of controlling electroplating film uniformity in response to metrology results are encompassed by the invention including adjusting current density, using current thieves or controlling workpiece rotation and/or fluid flow.

As an alternative to the electroplating reactors, electroless plating reactors (as described below) can be utilized in some applications.

Stripping Units

An example of the stripping unit 236 is described in "Micro-Environment For Processing A Workpiece", PCT/US99/05676 filed March 15, 1999 and/or in "Selective Treatment Of A Microelectronic Workpiece", PCT/US99/05674 filed Mar. 15, 1999 herein incorporated by reference. The "stripping units" are multifunctional processing capsules which can perform cleaning, stripping, bevel etching, rinsing and drying.

An apparatus for processing a microelectronic workpiece in a "micro-environment" is set forth in the aforementioned PCT applications. The apparatus includes a rotor motor and a microelectronic workpiece housing. The microelectronic workpiece housing is connected-to-be-rotated by the rotor motor. The microelectronic workpiece housing further defines a substantially closed processing chamber therein in which one or more processing fluids are distributed across at least one face of the microelectronic workpiece by centripetal accelerations generated during rotation of the housing.

The microelectronic workpiece housing includes an upper chamber member having a fluid inlet opening and a lower chamber member having a fluid inlet opening. The upper chamber member and the lower chamber member are joined to one another to form the substantially closed processing chamber. The processing chamber generally conforms to the shape of the microelectronic workpiece and includes at least one fluid outlet disposed at a peripheral region thereof. At least one microelectronic workpiece support is provided. The support is adapted to support a microelectronic workpiece in the substantially closed processing chamber in a position to allow centripetal acceleration distribution of a fluid supplied through the inlet opening of the upper chamber member across at least an upper face of the microelectronic workpiece when the microelectronic workpiece housing is rotated. The wafer is further positioned by the support to allow centripetal acceleration distribution of a fluid supplied through the inlet opening of the lower chamber member across at least a lower face of the microelectronic workpiece during the rotation. The at least one fluid outlet is positioned to allow extraction of fluid in the processing chamber through the action of centripetal acceleration.

An etchant capable of removing one or more of the thin film layers, such as the seed layer, can be caused to flow over the front side and an outer margin of the back side while the etchant is prevented from flowing over the back side except for the outer margin. Thus, a non-uniform seed layer, for example, can be stripped from the workpiece.

Seed Layer Enhancement Units

An example of the seed layer enhancement unit 232 is described in "Apparatus And Method For Electrolytically Depositing Copper On A Semiconductor Workpiece", PCT/US99/06306, filed Mar. 22, 1999 and herein incorporated by reference. The seed layer enhancement unit 232 can be embodied as an adjustable plating reactor as described in "Workpiece Processor Having Processing Chamber With Improved Processing Fluid Flow", PCT/US00/10210 filed Apr. 13, 2000 or "System For Electrochemically Processing A Workpiece", PCT/US00/10120 filed Apr. 13, 2000 herein incorporated by reference.

In accordance with a specific embodiment of the process, an ultra-thin adhesion layer, formed by physical vapor deposition (PVD), is enhanced by subjecting the semiconductor microelectronic workpiece to an electrochemical copper deposition process in which an alkaline bath having a complexing agent is employed. The copper complexing agent may be at least one complexing agent selected from a group consisting of EDTA, ED, and a polycarboxylic acid such as citric acid or salts thereof. The alkaline electrolytic copper bath is used to enhance the ultra-thin copper adhesion layer which has been deposited on a barrier layer using a deposition process such as PVD. The enhanced copper seed layer provides an excellent conformal copper coating that allows trenches and vias to be subsequently filled with a copper layer having good uniformity using electrochemical deposition techniques.

Alternately, the seed layer enhancement units 232 can be embodied as electroless plating reactors as described below.

Electroless Unit

Another process for depositing a layer (such as copper) onto a microelectronic workpiece is known as "electroless" plating. Unlike an electroplating reactor, electroless plating does not conduct external electrical power to the surface of a microelectronic workpiece. A catalytic material is used to effect plating of the material on the microelectronic workpiece. Electroless plating reactors and corresponding processes are disclosed in WO 00/03072, published Jan. 20, 2000; and U.S. Pat. Nos. 5,500,315; 5,389,496; and 5,139,818, all incorporated herein by reference. Electroless plating can be used instead of electroplating, or can be used as a seed layer enhancement step.

Annealing Units

The annealing units 244 can be as described in "Method And Apparatus For Tuning Multiple Electrodes Used In A Reactor For Electrochemically Processing A Microelectronic Workpiece", U.S. Ser. No. 60/206,663, filed May 24, 2000, or as in "Method And Apparatus For Low Temperature Annealing Of Metallization Micro-Structures In The Production Of A Microelectronic Device", PCT/US99/02504, filed Feb. 2, 1999; or as in "Method And Apparatus For Processing A Microelectronic Workpiece Including An Apparatus And Method For Executing A Processing Step At An Elevated Temperature", U.S. Ser. No. 09/501,002, filed Feb. 9, 2000; herein incorporated by reference. The annealing units 244 can include a thermal reactor that is adapted for rapid thermal processing (RTP).

The microelectronic workpieces are transferred between the processing stations and the annealing units 244 using the transport unit 256 that is disposed for linear movement along the central track.

Metrology Unit

Each of the metrology units 228, 932, 942, 952, 1020, 1036 can be a four-point probe style metrology tool. The metrology units can use sheet resistance or capacitance to determine layer thickness. Alternately, the metrology units can use optical or thermal reference methods. According to an exemplary embodiment, the metrology units use a laser based non-constant metrology system wherein the laser induces an acoustic response in the measured film and the acoustic response is related to film thickness. This is known as impulsive stimulated thermal scattering (ISTS). One such system is manufactured by Philips Analytical under the model name "IMPULSE" or "EMERALD". Another such metrology unit is manufactured by Rudolf Technologies, under the model name "METAPULSE."

Input/Output Station

The input/output station is described in "Apparatus For Processing A Microelectronic Workpiece Including Improved Input/Output Station," attorney docket no. SEM4492P1240, fled on Jul. 7, 2000 or in "Semiconductor Processing Apparatus Having Lift And Tilt Mechanism", PCT/US98/00076 filed Jan. 5, 1998, both herein incorporated by reference. The input/output section includes an opening through which the one or more cassettes are received by a multi-cassette interface. The multi-cassette interface can selectively adjust the alignment of the one or more cassettes with respect to one or more corresponding direct-access assemblies for transfer therebetween. The one or more direct-access assemblies receive the one or more cassettes from the multi-cassette interface and position them to allow direct access to individual microelectronic workpiece positions of the one or more cassettes, including direct access to any microelectronic workpieces disposed at the microelectronic workpiece positions.

Non-Compliance Station

The non-compliance station comprises a cassette for holding multiple microelectronic workpieces. The cassette can be automated, for example to be sent back to the PVD seed layer deposition station for reestablishing a seed layer on the microelectronic workpiece substrates.

Linear Robot System

The linear robot system can be as described in "Semiconductor Processing Apparatus Having Linear Conveyor System", PCT/US98/00132 filed Jan. 6, 1998; or "Semiconductor Processing Apparatus Having Lift And Tilt Mechanism", PCT/US98/00076 filed Jan. 5, 1998; or "Robots For Microelectronic Workpiece Handling", PCT/US99/15567 filed Jul. 9, 1999, all herein incorporated by reference.

Chemical Mechanical Polishing Station

Chemical mechanical polishing tools are disclosed in WO 00/26609, published May 11, 20000, and U.S. Pat. No. 5,738,574, herein incorporated by reference.

From the foregoing, it will be observed that numerous variations and modifications may be effected without departing from the spirit and scope of the invention. It is to be understood that no limitation with respect to the specific apparatus illustrated herein is intended or should be inferred. It is, of course, intended to cover by the appended claims all such modifications as fall within the scope of the claims.

We claimed:

1. A processing apparatus for processing a microelectronic workpiece, comprising:

an in-line metrology unit having a space for receiving a microelectronic workpiece for measuring a condition of a first layer on the microelectronic workpiece and generating a condition signal;

a control, signal-connected to the metrology unit;

a process unit providing a space to receive the microelectronic workpiece and performing an electrochemical process that is controlled by the control, wherein the process unit comprises an electroplating reactor having at least one anode and a workpiece holder to hold the microelectronic workpiece as cathode, and wherein the process is dependent on the current between the anode and the cathode, and wherein the control adjusts the current in response to the condition signal; and a transport unit positioned to receive the microelectronic workpiece from at least one of the process unit and the in-line metrology unit and move the microelectronic workpiece to the other of the process unit and the in-line metrology unit, wherein the condition signal from the metrology unit to the control influences said process, and is representative of a thickness of a seed layer applied onto the microelectronic workpiece.

2. The apparatus according to claim 1, further comprising a non-compliance unit, and wherein the transport unit is signal-connected to the control, further wherein the condition signal from the metrology unit influences the control to cause the transport unit to transfer the microelectronic workpiece to the noncompliance unit.

3. The apparatus according to claim 1, wherein the first layer comprises a seed layer, and wherein the process unit includes a seed layer enhancement unit, and wherein the transport unit is signal-connected to the control, wherein the condition signal from the metrology unit influences said control to cause the transport unit to transport a microelectronic workpiece to the seed layer enhancement unit.

4. The apparatus according to claim 1, wherein the electroplating reactor comprises a plurality of anodes and the control adjusts current between each anode and the cathode.

5. The apparatus according to claim 1, wherein the process unit comprises a chemical mechanical polishing tool.

6. The apparatus according to claim 1, wherein the process unit comprises a chemical mechanical polishing tool, and the first layer comprises a layer on the workpiece just after chemical mechanical polishing by the chemical mechanical polishing tool.

7. A processing apparatus for processing a microelectronic workpiece, comprising:
an in-line metrology unit having a space for receiving a microelectronic workpiece for measuring a condition of a first layer on the microelectronic workpiece and generating a condition signal, wherein the metrology unit is configured to measure a thickness of a seed layer and measure a thickness of a process layer deposited on the seed layer;
a control, signal-connected to the metrology unit; and a process unit providing a space to receive the microelectronic workpiece and performing an electrochemical process that is controlled by the control, wherein the process unit comprises a chemical mechanical polishing tool, and the first layer comprises a layer on the workpiece just prior to chemical mechanical polishing by the chemical mechanical polishing tool.

8. The apparatus according to claim 7, further comprising a non-compliance unit, and wherein the transport unit is signal-connected to the control, further wherein the condition signal from the metrology unit influences the control to cause the transport unit to transfer the microelectronic workpiece to the noncompliance unit.

9. A processing apparatus for processing a microelectronic workpiece, comprising:
an in-line metrology unit having a space for receiving a microelectronic workpiece for measuring a condition of a first layer on the microelectronic workpiece and generating a condition signal, wherein the metrology unit is configured to measure a thickness of a seed layer and measure a thickness of a process layer deposited on the seed layer;
a control, signal-connected to the metrology unit;
a process unit providing a space to receive the microelectronic workpiece and performing an electrochemical process that is controlled by the control; and
a transport unit positioned to receive the microelectronic workpiece from at least one of the process unit and the in-line metrology unit and move the microelectronic workpiece to the other of the process unit and the in-line metrology unit,
wherein the condition signal from the metrology unit to the control influences the process.

10. The apparatus according to claim 9, further comprising a non-compliance unit, and wherein the transport unit is signal-connected to the control, further wherein the condition signal from the metrology unit influences the control to cause the transport unit to transfer the microelectronic workpiece to the noncompliance unit.

11. The apparatus according to claim 9, wherein the first layer comprises a seed layer, and wherein the process unit includes a seed layer enhancement unit, and wherein the transport unit is signal-connected to the control, wherein the condition signal from the metrology unit influences the control to cause the transport unit to transport a microelectronic workpiece to the seed layer enhancement unit.

12. The apparatus according to claim 9, wherein the process unit comprises a chemical mechanical polishing tool.

13. The apparatus according to claim 9, wherein the process unit comprises a chemical mechanical polishing tool, and the first layer comprises a layer on the workpiece just prior to chemical mechanical polishing by the chemical mechanical polishing tool.

14. The apparatus according to claim 9, wherein the process unit comprises a chemical mechanical polishing tool, and the first layer comprises a layer on the workpiece just after chemical mechanical polishing by the chemical mechanical polishing tool.

15. The apparatus according to claim 9, wherein the process unit comprises an electroplating reactor having at least one anode and a workpiece holder to hold a microelectronic workpiece as cathode, and the process is dependent on the current between the anode and the cathode, the control adjusting the current in response to the condition signal.

16. The apparatus according to claim 15, wherein the condition signal is representative of a thickness of a seed layer applied onto the microelectronic workpiece.

17. The apparatus according to claim 15, wherein the electroplating reactor comprises a plurality of anodes and the control adjusts current between each anode and the cathode.

* * * * *